(12) United States Patent
Tai et al.

(10) Patent No.: US 8,546,511 B2
(45) Date of Patent: Oct. 1, 2013

(54) POLYAMIDEIMIDE RESIN FOR FLEXIBLE PRINTED CIRCUIT BOARDS; METAL-CLAD LAMINATE, COVERLAY, AND FLEXIBLE PRINTED CIRCUIT BOARD THAT USE THIS RESIN; AND RESIN COMPOSITION

(75) Inventors: Makoto Tai, Joetsu (JP); Shu Dobashi, Joetsu (JP)

(73) Assignee: Arisawa Mfg. Co., Ltd., Joetsu-Shi (JP)

( * ) Notice: Subject to any disclaimer, the term of this patent is extended or adjusted under 35 U.S.C. 154(b) by 634 days.

(21) Appl. No.: 11/652,462

(22) Filed: Jan. 11, 2007

(65) Prior Publication Data

US 2007/0166559 A1    Jul. 19, 2007

(30) Foreign Application Priority Data

Jan. 18, 2006    (JP) .................................. 2006-010346

(51) Int. Cl.
    *C08G 8/02* (2006.01)
(52) U.S. Cl.
    USPC ........................................................ 528/125
(58) Field of Classification Search
    USPC ........................................................ 528/125
    See application file for complete search history.

(56) References Cited

U.S. PATENT DOCUMENTS

| | | | | |
|---|---|---|---|---|
| 3,856,559 A | * | 12/1974 | Nakagome | 427/379 |
| 4,785,069 A | * | 11/1988 | Kouno et al. | 528/51 |
| 4,937,316 A | | 6/1990 | Ohta et al. | |
| 5,118,778 A | | 6/1992 | Lambla et al. | |
| 5,750,257 A | * | 5/1998 | Doshita et al. | 428/379 |
| 6,670,442 B1 | | 12/2003 | Rossini et al. | |
| 2004/0236012 A1 | | 11/2004 | Xu | |
| 2005/0165209 A1 | | 7/2005 | Kurita et al. | |
| 2005/0196619 A1 | * | 9/2005 | Nakanishi et al. | 428/416 |
| 2005/0282010 A1 | | 12/2005 | Xu | |

FOREIGN PATENT DOCUMENTS

| | | | |
|---|---|---|---|
| CN | 1057273 A | | 12/1991 |
| CN | 1604974 A | | 4/2005 |
| JP | 64-43578 | * | 2/1989 |
| JP | 64-43578 A | | 2/1989 |
| JP | 03-253340 A | | 11/1991 |
| JP | 07-037438 A | | 2/1995 |
| JP | 2005-325329 A | | 11/2005 |

(Continued)

OTHER PUBLICATIONS

Huang et al., "Synthesis and Manufacture of Polyamide-imide/Copper Foil Laminates without Adhesive", Polymers & Polymer Composites, Jan. 1, 2006, 14(1):89-105.

*Primary Examiner* — Shane Fang
(74) *Attorney, Agent, or Firm* — Drinker Biddle & Reath LLP (57) ABSTRACT

The present invention provides a polyamideimide resin for flexible printed circuit boards that prior to curing exhibits an excellent solubility, processability, and handling characteristics, and that after curing exhibits flame retardancy, solder heat resistance, circuit embeddability, and flexibility and further has a high glass-transition temperature (Tg) and is able to maintain a high adhesive strength. The present invention provides a polyamideimide resin for flexible printed circuit boards, which is obtained by the polymerization reaction of an acid component comprising at least a monoanhydride and an aromatic dicarboxylic acid with a diisocyanate compound or diamine compound in an approximately equimolar amount with respect to the total molar amount of the acid component, wherein the molar amount of the monoanhydride is 0.4 to 0.8 taking the total molar amount of the acid component as 1.

5 Claims, 5 Drawing Sheets

(56) References Cited

FOREIGN PATENT DOCUMENTS

| | | | |
|---|---|---|---|
| KR | 1992-6366 | B1 | 8/1992 |
| KR | 1992-99881 | B1 | 8/1992 |
| KR | 2001-99881 | A | 11/2001 |
| KR | 2004-94730 | A | 11/2004 |

\* cited by examiner

POLYAMIDEIMIDE RESIN FOR FLEXIBLE PRINTED CIRCUIT BOARDS; METAL-CLAD LAMINATE, COVERLAY, AND FLEXIBLE PRINTED CIRCUIT BOARD THAT USE THIS RESIN; AND RESIN COMPOSITION

The entire disclosure of Japanese Patent Application No. 2006-010346, filed on Jan. 18, 2006, is expressly incorporated by reference herein.

BACKGROUND

The present invention relates to a polyamideimide resin for flexible printed circuit boards; a metal-clad laminate, a coverlay, and a flexible printed circuit board that employ this resin; and a resin composition that contains this resin.

Coverlays and flexible printed circuit boards (FPCs), for example, metal-clad laminates, comprising suitable combinations of, for example, an electrically insulating resin layer, e.g., of polyimide film or polyamide film, an adhesive layer in which the main component is epoxy resin or polyimide resin, and an electroconductive metal foil layer, e.g., of copper foil, silver foil, or aluminum foil, are already in use.

FPCs have been made lighter and thinner in recent years accompanying the trend toward lighter and thinner electronic and electric devices.

For example, metal-clad laminates are undergoing a conversion from three-layer substrate structures comprising a resin film layer, adhesive layer, and metal foil layer, to two-layer substrate structures comprising a resin film layer and a metal foil layer.

In the case of coverlays, on the other hand, there are limits on the pursuit of weight and thickness reductions while still maintaining the properties since coverlays comprise only a resin layer and an adhesive layer.

With regard to methods for solving the aforementioned problem of making coverlays lighter and thinner, for example, a printed circuit board is known in which a resin composition layer comprising polyamideimide resin and/or polyimide resin is laminated without an interposed adhesive layer on a metal foil layer that has already been formed into circuitry (for example, Japanese Patent Application Laid-open No. H3-253340).

It is also known that a polyamideimide paint obtained by the reaction of trimellitic anhydride and aliphatic dicarboxylic acid (molar ratio=1:2 to 2:1) with a diisocyanate compound in an amount approximately equimolar with these two components can be utilized as a dielectric layer for dielectric wires (for example, Japanese Patent Application Laid-open No. H7-37438).

Moreover, it is known that a polyamideimide resin composition containing repeat units from naphthalenediisocyanate and, for example, monoanhydride, dianhydride, or dicarboxylic acid, at respective specific molar ratios can be used in metal-clad laminates (for example, Japanese Patent Application Laid-open No. 2005-325329).

SUMMARY

In the case of the printed circuit board of Japanese Patent Application Laid-open No. H3-253340, however, there are restrictions on factors such as the viscosity and thickness of the resin composition layer comprising polyamideimide resin and/or polyimide resin, and, while a satisfactory adhesive strength is obtained, the flame retardancy and solder heat resistance are poor.

While polyamideimide paint obtained from trimellitic anhydride and aliphatic dicarboxylic acid as in Japanese Patent Application Laid-open No. H7-37438 does provide a satisfactory heat resistance when used as a dielectric layer for dielectric wires, the flame retardancy and solder heat resistance are poor.

While heat resistance is obtained when the polyamideimide resin composition of Japanese Patent Application Laid-open No. 2005-325329 is used as a precursor material for FPCs such as metal-clad laminates, satisfactory handling properties and a satisfactory adhesiveness are not obtained. Moreover, the compatibility (solubility) is reduced due to the presence of large amounts of the naphthalene skeleton in the main chain, making it difficult to apply a desired thickness due to the reduced composition concentration that accompanies this.

Accordingly, an object of the present invention is to provide a polyamideimide resin for flexible printed circuit boards, that prior to curing exhibits an excellent solubility, processability, and handling characteristics, and that after curing exhibits flame retardancy, solder heat resistance, circuit embeddability, and flexibility and further has a high glass-transition temperature (Tg) and is able to maintain a high adhesive strength. An additional object of the present invention is to provide a resin composition that contains this polyamideimide resin for flexible printed circuit boards.

Additional objects of the present invention are to provide an excellent coverlay, metal-clad laminate, and flexible printed circuit board that in each case use the aforementioned polyamideimide resin for flexible printed circuit boards.

The present invention provides (1) a polyamideimide resin for flexible printed circuit boards, which is obtained by the polymerization reaction of an acid component comprising at least a monoanhydride and an aromatic dicarboxylic acid with a diisocyanate compound or diamine compound in an approximately equimolar amount with respect to the total molar amount of the acid component, wherein the molar amount of the monoanhydride is 0.4 to 0.8 taking the total molar amount of the acid component as 1; (2) a polyamideimide resin for flexible printed circuit boards, which is obtained by the polymerization reaction of an acid component comprising at least a monoanhydride, an aromatic dicarboxylic acid, and an aliphatic dicarboxylic acid with a diisocyanate compound or a diamine compound in an approximately equimolar amount with respect to the total molar amount of the acid component, wherein, taking the total molar amount of the acid component as 1, the molar amount of the monoanhydride is 0.5 to 0.8, the molar amount of the aromatic dicarboxylic acid is 0.1 to 0.4, and the molar amount of the aliphatic dicarboxylic acid is 0.05 to 0.2; (3) a polyamideimide resin for flexible printed circuit boards, which is obtained by the polymerization reaction of an acid component comprising at least a dianhydride and an aromatic dicarboxylic acid with a diisocyanate compound or diamine compound in an approximately equimolar amount with respect to the total molar amount of the acid component, wherein the molar amount of the dianhydride is 0.2 to 0.4 taking the total molar amount of the acid component as 1; (4) the polyamideimide resin for flexible printed circuit boards according to (3), wherein the acid component further contains an aliphatic dicarboxylic acid; (5) a metal-clad laminate in which the polyamideimide resin for flexible printed circuit boards according to any of (1) to (4) is formed as a layer on a metal foil; (6) a coverlay in which the polyamideimide resin for flexible printed circuit boards according to any of (1) to (4) is formed as a film; (7) a flexible printed circuit board comprising the coverlay according to (6) disposed on a metal foil that has been formed into a circuit; and (8) a resin composition comprising the polyamideimide resin for flexible printed circuit boards according to any of (1) to (4).

The present invention can provide a polyamideimide resin for flexible printed circuit boards, that prior to curing exhibits an excellent solubility, processability, and handling characteristics, and that after curing exhibits an excellent flame retardancy, solder heat resistance, circuit embeddability, and flexibility and further has a high glass-transition temperature and is able to maintain a high adhesive strength.

In addition, the polyamideimide resin according to the present invention for flexible printed circuit boards is well adapted for application to metal-clad laminates, coverlays, and flexible printed circuit boards.

DETAILED DESCRIPTION

Embodiments of the present invention are described below. The following embodiments are provided as examples to describe the present invention, but it should not be construed that the present invention is limited only to these embodiments. The present invention can be executed in a variety of embodiments within the scope of its essential features.

(The Polyamideimide Resin for Flexible Printed Circuit Boards)

The polyamideimide resin for flexible printed circuit boards according to the first invention is a polyamideimide resin for flexible printed circuit boards that is obtained by the polymerization reaction of an acid component comprising at least a monoanhydride and aromatic dicarboxylic acid with a diisocyanate compound or diamine compound in an approximately equimolar amount with respect to the total molar amount of the acid component, wherein the molar amount of the monoanhydride is 0.4 to 0.8 taking the total molar amount of the acid component as 1.

That is, the ratio between the molar amount of the monoanhydride and the molar amount of the aromatic dicarboxylic acid (molar amount of the monoanhydride/molar amount of the aromatic dicarboxylic acid) is in the range of 0.4/0.8 to 0.6/0.2.

Due to this composition, the polyamideimide resin according to the present invention prior to curing exhibits an excellent solubility, processability, and handling characteristics; after curing exhibits an excellent flame retardancy, solder heat resistance, circuit embeddability, and flexibility and further has a high glass-transition temperature and is able to maintain a high adhesive strength; and is useful for application as a flexible printed circuit board.

In particular, since at least a certain amount of imide component can be ensured by setting the molar amount of the monoanhydride at greater than or equal to 0.4 taking the total molar amount of the acid component as 1, a high Tg and a good flame retardancy can be maintained; in addition, a good solder heat resistance and dimensional stability are obtained because moisture absorption can be inhibited.

In addition, since at least a certain amount of amide component can be ensured by setting the molar amount of the monoanhydride at no more than 0.8 taking the total molar amount of the acid component as 1, a high adhesiveness is obtained and a good circuit embeddability is obtained in application as a coverlay.

The molar amount of the monoanhydride is more preferably 0.5 to 0.8 taking the total molar amount of the acid component as 1.

The polyamideimide resin for flexible printed circuit boards according to the second invention is a polyamideimide resin for flexible printed circuit boards obtained by the polymerization reaction of an acid component comprising at least a monoanhydride, an aromatic dicarboxylic acid, and an aliphatic dicarboxylic acid with a diisocyanate compound or a diamine compound in an approximately equimolar amount with respect to the total molar amount of the acid component, wherein, taking the total molar amount of the acid component as 1, the molar amount of the monoanhydride is 0.5 to 0.8, the molar amount of the aromatic dicarboxylic acid is 0.1 to 0.4, and the molar amount of the aliphatic dicarboxylic acid is 0.05 to 0.2.

Due to this composition, the polyamideimide resin according to the present invention prior to curing exhibits an excellent solubility, processability, and handling characteristics; after curing exhibits an excellent flame retardancy, solder heat resistance, circuit embeddability, and flexibility and further has a high glass-transition temperature and is able to maintain a high adhesive strength; and is useful for application as a flexible printed circuit board.

When the aforementioned acid component comprises at least monoanhydride, aromatic dicarboxylic acid, and aliphatic dicarboxylic acid, the addition of at least 0.1 aromatic dicarboxylic acid, taking the total molar amount of the acid component as 1, is preferred from the standpoint of maintaining the post-cure Tg. In addition, the addition of at least 0.05 aliphatic dicarboxylic acid, taking the total molar amount of the acid component as 1, is preferred from the standpoint of maintaining the post-cure adhesiveness.

The ratio between the molar amounts of the aromatic dicarboxylic acid and the aliphatic dicarboxylic acid (former/latter) is preferably 70/30 to 50/50 when the polyamideimide resin according to the present invention is used for a coverlay.

The ratio between the molar amounts of the aromatic dicarboxylic acid and the aliphatic dicarboxylic acid (former/latter) is preferably 80/20 to 70/30 when the polyamideimide resin according to the present invention is used for a substrate.

The polyamideimide resin for flexible printed circuit boards according to the third invention is a polyamideimide resin for flexible printed circuit boards obtained by the polymerization reaction of an acid component comprising at least a dianhydride and an aromatic dicarboxylic acid with a diisocyanate compound or diamine compound in an approximately equimolar amount with respect to the total molar amount of the acid component, wherein the molar amount of the dianhydride is 0.2 to 0.4 taking the total molar amount of the acid component as 1.

Due to this composition, the polyamideimide resin according to the present invention prior to curing exhibits an excellent solubility, processability, and handling characteristics; after curing exhibits an excellent flame retardancy, solder heat resistance, circuit embeddability, and flexibility and further has a high glass-transition temperature and is able to maintain a high adhesive strength; and is useful for application as a flexible printed circuit board.

The acid component in this polyamideimide resin may also contain an aliphatic dicarboxylic acid in addition to the dianhydride and the aromatic dicarboxylic acid.

The monoanhydride used by the present invention can be exemplified by the anhydride of terephthalic acid, isophthalic acid, trimellitic acid, 4,4'-biphenyldicarboxylic acid, sebacic acid, maleic acid, fumaric acid, and dimer acid.

The dianhydride can be exemplified by the anhydride of diphenylsulfonetetracarboxylic acid, benzophenonetetracarboxylic acid, pyromellitic acid, naphthalenetetracarboxylic acid, diphenyltetracarboxylic acid, bis(dicarboxyphenyl)propane, bis(dicarboxyphenyl)sulfone, and bis(dicarboxyphenyl)ether.

A monoanhydride containing a plurality of aromatic rings in its structure, such as the anhydride of terephthalic acid or 4,4'-biphenyldicarboxylic acid, may be used with the goal of raising the Tg, insofar as this does not influence the compatibility (solubility).

The aromatic dicarboxylic acid can be exemplified by terephthalic acid, isophthalic acid, 4,4'-biphenyldicarboxylic acid, and naphthalenedicarboxylic acid, wherein terephthalic acid is preferred from a cost standpoint. Two or more aromatic dicarboxylic acids may also be used in combination.

The aliphatic dicarboxylic acid is not specifically limited and preferably a saturated dicarboxylic acid and also can be exemplified by adipic acid, sebacic acid, maleic acid, fumaric acid, decanedioic acid, dodecanedioic acid, and dimer acid, wherein adipic acid is preferred from a cost standpoint. Two or more aliphatic dicarboxylic acids may also be used in combination.

The diisocyanate compounds and diamine compounds generally used in FPC applications can be used with no particular limitation as the diisocyanate compound and diamine compound used in the present invention; however, aromatic diisocyanate compounds and diamine compounds having an aromatic ring in the main chain are preferred.

In addition, a structure that does not influence the compatibility (solubility) is preferred from a processability standpoint. With regard to whether a diisocyanate compound or diamine compound is to be used, an appropriate selection can be made based on the method of production and conditions. Combinations of both types of compounds may also be used.

4,4'-diphenyl ether diisocyanate, tolylenediisocyanate (TDI), 4,4'-diphenylmethanediisocyanate, and 1,5-naphthalenediisocyanate are preferred for the diisocyanate compound because they satisfy the properties required of FPC precursor materials from the standpoints of reactivity and processability.

Other usable diisocyanate compounds can be exemplified by xylylenediisocyanate (XDI), 3,3'-dimethyldiphenyl-4,4'-diisocyanate, 3,3'-diethyldiphenyl-4,4'-diisocyanate, naphthylene-1,5-diisocyanate (NDI), tetramethylxylenediisocyanate (TMXDI), isophoronediisocyanate (IPDI), hydrogenated xylylenediisocyanate ($H_6$XDI), dicyclohexylmethanediisocyanate ($H_{12}$MDI), hexamethylenediisocyanate (HDI), dimer acid diisocyanate (DDI), norbornene diisocyanate (NBDI), and trimethylhexamethylenediisocyanate (TMDI), and any two or more can be used in combination.

p-phenylenediamine and 4,4'-diaminediphenyl ether are preferred for the diamine compound because they fulfill the properties required of FPC precursor materials from the standpoints of reactivity and processability.

Other usable diamine compounds can be exemplified by m-phenylenediamine, 4,4'-diaminodiphenyl sulfone, 4,4'-diaminobenzophenone, 2,2'-bis(4-aminophenyl)propane, 2,4-tolylenediamine, 2,6-tolylenediamine, p-xylylenediamine, m-xylylenediamine, and hexamethylenediamine, and any two or more can be used in combination.

(The Resin Composition)

The resin composition according to the present invention contains the aforementioned polyamideimide resin for flexible printed circuit boards.

An example of the resin composition according to the present invention is the resin composition provided by blending the aforementioned polyamideimide resin for flexible printed circuit boards with a flame retardant for the purpose of obtaining an even better flame retardancy. The flame retardant can be exemplified by inorganic fillers such as aluminum hydroxide, silica, and barium sulfate and by organophosphorus compounds such as phosphate esters. These can be used individually or in combination.

The inorganic filler is preferably added at 30 to 70 weight % with reference to the total weight of the solids fraction of the acid component and diisocyanate or diamine.

The organophosphorus compound is preferably added at 10 to 30 weight % with reference to the total weight of the solids fraction of the acid component and diisocyanate or diamine.

When the phosphorus content in the organophosphorus compound is 10 to 20 weight %, the organophosphorus compound is preferably added at 10 to 20 weight % with reference to the total weight of the solids fraction of the acid component and diisocyanate or diamine.

(Example of a Method for Synthesizing the Polyamideimide Resin for Flexible Printed Circuit Boards)

60 moles trimellitic anhydride is added as the acid anhydride and 40 moles terephthalic acid is added as the dicarboxylic acid to a reactor containing N-methyl-2-pyrrolidone. 100 moles 4,4'-diphenylmethanediisocyanate is then added as the diisocyanate compound so as to provide an amount approximately equimolar with the total molar amount of the acid anhydride and dicarboxylic acid. A suitable amount of N-methyl-2-pyrrolidone is added so as to bring the solids concentration to 45 weight %, thereby giving a polyamideimide resin-precursor composition.

Polymerization (prepolymerization) is then carried out with stirring under curing conditions of (1) 2 hours at 80° C., (2) 5 hours at 120° C., and (3) 1 hour at 150° C. This is followed by cooling and dilution to a solids concentration of 25 weight % by the addition of a dilution solvent such as dimethylformamide, N-methyl-2-pyrrolidone, or dimethylacetamide, thus yielding a coatable polyamideimide resin.

(The Metal-clad Laminate)

The metal-clad laminate according to the present invention is a metal-clad laminate in which the aforementioned polyamideimide resin for flexible printed circuit boards is formed as a layer on a metal foil.

Figure 1:
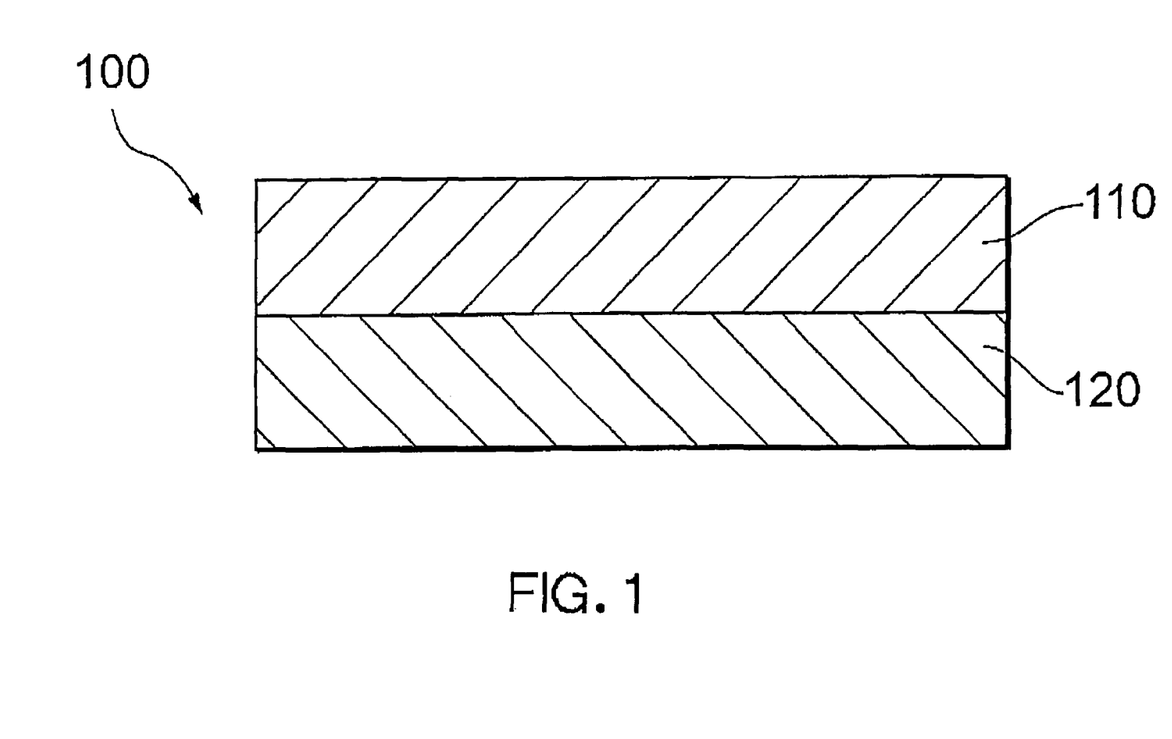
FIG. 1 is a schematic cross section that shows an embodiment of a metal-clad laminate (single-sided metal-clad laminate) according to the present invention.

FIG. 1 is a schematic cross section that shows an embodiment of a metal-clad laminate 100 according to the present invention.

As shown in FIG. 1, the metal-clad laminate 100 is a single-sided metal-clad laminate constructed from a metal foil 120 and the aforementioned polyamideimide resin 110 for flexible printed circuit boards.

The metal foil 120 comprises a metal foil such as, for example, copper, silver, or aluminum. The thickness of the metal foil 120 is established as appropriate within the range of thicknesses used in the field of electronic materials.

By virtue of the structure herein described, this metal-clad laminate 100 exhibits an excellent flame retardancy and solder heat resistance and can maintain a high adhesiveness and can be made lighter and thinner than the prior art.

The metal-clad laminate 100 can be fabricated by a step in which a coating layer is formed by coating the polyamideimide resin-precursor composition on the surface of the metal foil 120 and a curing step in which the coating layer is cured under prescribed curing conditions and the organic solvent present in the coating layer is dried off, yielding the resin layer 110.

With regard to the step in which the coating layer is formed, the thickness of the coating layer formed on the metal foil 120 will vary with the application, but is suitably established in the range of 2 to 150 μm. A suitable coating method can be used in correspondence to the coated thickness, for example, a comma coater, die coater, or gravure coater.

The aforementioned curing step is preferably carried out at a curing temperature of 160 to 220° C. for a curing time of 3 to 30 hours.

The metal-clad laminate 100 can also be fabricated by the coverlay formation method as follows.

The polyamideimide resin-precursor composition is first coated on a release film, e.g., PET (polyethylene terephthalate) film, PP (polypropylene) film, PE (polyethylene) film, to form a coating layer and a resin layer is then obtained by curing and drying under prescribed curing and drying conditions (temperature=80 to 160° C., time=1 to 30 minutes) to yield a semi-cured state (also called the B-stage below). The ability to release the resin layer can be improved by subjecting the surface of the release film to a release treatment.

The metal-clad laminate is subsequently fabricated by pasting the resin surface of the resin layer on a rough surface of the metal foil. For example, the use of a press or lamination using a hot roll can be employed as the pasting method. The pasting conditions are preferably a temperature of 200 to 350° C. and a pressure of 0.5 to 5 MPa.

While the preceding description relates to a single-sided metal-clad laminate, it can also be applied to a two-sided metal-clad laminate (not shown) in which metal foil is placed on both sides of the resin layer.

A two-sided metal-clad laminate can be fabricated by placing metal foil on both sides of a resin sheet fabricated by the aforementioned coverlay formation method and thereafter carrying out hot-press bonding by the pasting method cited above.

(The Coverlay)

The coverlay according to the present invention is a coverlay in which the aforementioned polyamideimide resin for flexible printed circuit boards is formed as a film.

Figure 2:
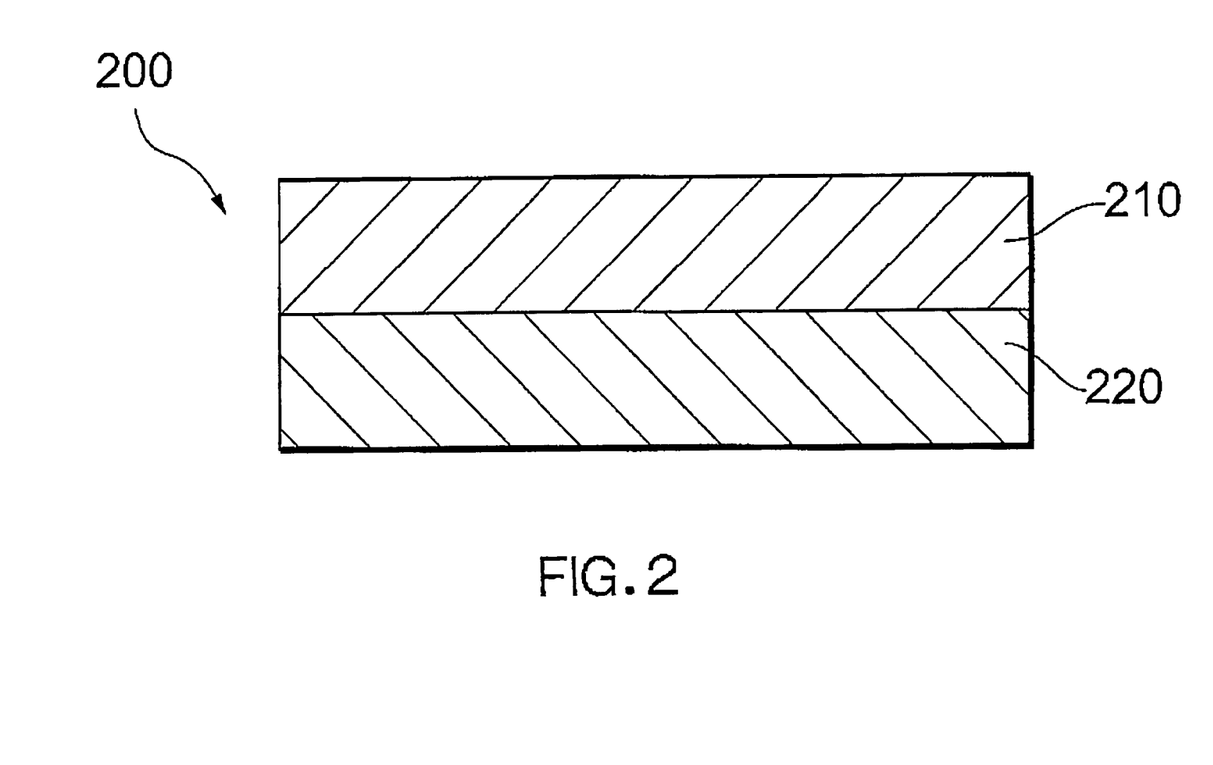
FIG. 2 is a schematic cross section that shows an embodiment of a coverlay according to the present invention.

FIG. 2 is a schematic cross section that shows an embodiment of the coverlay according to the present invention.

As shown in FIG. 2, the coverlay 200 is constructed from a layer 210 of the aforementioned polyamide resin for flexible printed circuit boards and a release film 220.

Due to the presence of the resin layer 210 comprising the aforementioned polyamideimide resin, the coverlay 200 exhibits an excellent flame retardancy, an excellent solder heat resistance, and the excellent circuit embeddability expected of coverlays, and can maintain a high adhesiveness and can also be made lighter and thinner due to the integration into a single feature of the resin layer and the adhesive layer that is a component of previous coverlays.

In addition, the coverlay according to the present invention, because it can be used without having to modify an existing flexible printed circuit board fabrication process, can also reduce production costs from an equipment standpoint.

The coverlay 200 can be fabricated by forming a resin layer 210 on a release film 220 by the previously described coverlay formation method.

In the coverlay formation method, the resin layer 210 need not be completely cured and is obtained by curing and drying under prescribed curing and drying conditions (temperature=80 to 160° C., time=1 to 30 minutes) to yield a semi-cured state (B-stage). The release film 220 may be disposed on both sides of the resin layer 210 and is peeled off at the time of application.

(The Flexible Printed Circuit Board)

The flexible printed circuit board according to the present invention is a flexible printed circuit board in which the aforementioned coverlay is disposed on a metal foil that has been formed into a circuit.

The thickness of the flexible printed circuit board according to the present invention can be freely set in accordance with its application.

The aforementioned coverlay can also function in the flexible printed circuit board as the interlayer adhesive (bonding sheet) that is used in a multilayer printed circuit board. Specifically, a multilayer printed circuit board can be fabricated by layering the coverlay on the circuit-patterned plane elaborated in the metal foil in a flexible printed circuit board, layering a separate flexible printed circuit board thereon, and heating and pressing under prescribed conditions.

As a consequence, a bonding sheet is no longer required for joining flexible printed circuit boards in which a coverlay is disposed on the circuit-patterned side, and it then becomes possible to make a multilayer printed circuit board that is lighter and thinner. Higher density multilayer printed circuit boards can also be prepared.

When lamination is carried out with the circuit-patterned sides of flexible printed boards facing each other, the coverlay must be thick enough that the facing circuit-patterned sides do not come into contact with one another.

The flexible printed circuit board according to the present invention is well adapted for application as a so-called chip-on flexible printed circuit board for IC chip mounting.

EXAMPLES

The present invention is described in additional detail by the examples that follow, but the present invention is not limited by these examples. The individual skilled in the art can add and execute various modifications, not only to the examples provided below, and these modifications are also encompassed in the scope of the claims.

Examples 1 to 10 and Comparative Examples 1 to 10

Polyamideimide resin-precursor compositions were first prepared from the individual components in the proportions (unit for the numerical values: mole) shown in Tables 1 and 2.

The molar quantities shown in Tables 1 and 2 of the acid anhydride and dicarboxylic acid were added to a reactor that contained N-methyl-2-pyrrolidone. 100 moles of the diisocyanate compound was then added so as to give an amount approximately equimolar with the total moles of the acid anhydride and dicarboxylic acid. N-methyl-2-pyrrolidone was additionally added in an amount sufficient to bring the solids concentration to 45 weight %, yielding the particular polyamideimide resin-precursor composition.

TABLE 1

|  |  | Example 1 | Example 2 | Example 3 | Example 4 | Example 5 | Comp. Ex. 1 | Comp. Ex. 2 | Comp. Ex. 3 | Comp. Ex. 4 | Comp. Ex. 5 |
|---|---|---|---|---|---|---|---|---|---|---|---|
| components | TMA | 60 | 40 | 80 |  |  | 30 | 90 |  |  | 60 |
|  | PMDA |  |  |  | 20 | 40 |  |  | 10 | 50 |  |
|  | TPA | 40 | 60 | 20 | 80 | 60 | 70 | 10 | 90 | 50 |  |
|  | ADA |  |  |  |  |  |  |  |  |  | 40 |
|  | MDI | 100 | 100 | 100 | 100 | 100 | 100 | 100 | 100 | 100 | 100 |
|  | NDI |  |  |  |  |  |  |  |  |  |  |
| results of evaluation | varnish stability | OK | OK | OK | OK | OK | OK | OK | OK | OK | OK |
|  | flame retardancy | very good | good | very good | good | very good | poor | very good | poor | very good | poor |
|  | peel strength | 12 very good | 10 very good | 7 good | 9 good | 7 good | 10 very good | 3 poor | 11 very good | 5 poor | 14 very good |
|  | Tg (° C.) | 280 | 260 | 300 | 280 | 290 | 240 | 300 | 245 | 300 | 190 |
|  | solder heat resistance | good | good | good | good | good | poor | good | poor | good | poor |
|  | circuit embeddability | good | good | good | good | good | good | poor | good | poor | good |
|  | bendability | OK | OK | OK | OK | OK | OK | OK | OK | OK | OK |
|  | migration | very good | very good | very good | very good | very good | good | very good | good | very good | good |

TABLE 2

|  |  | Example 6 | Example 7 | Example 8 | Example 9 | Example 10 | Comp. Ex. 6 | Comp. Ex. 7 | Comp. Ex. 8 | Comp. Ex. 9 | Comp. Ex. 10 |
|---|---|---|---|---|---|---|---|---|---|---|---|
| components | TMA | 70 | 50 | 80 | 60 | 70 | 40 | 90 | 50 | 75 | 65 |
|  | PMDA |  |  |  |  |  |  |  |  |  |  |
|  | TPA | 20 | 40 | 10 | 20 | 25 | 50 | 15 | 45 | 5 | 10 |
|  | ADA | 10 | 10 | 10 | 20 | 5 | 10 | 5 | 5 | 20 | 25 |
|  | MDI | 100 | 100 | 100 | 100 | 100 | 100 | 100 | 100 | 100 | 100 |
|  | NDI |  |  |  |  |  |  |  |  |  |  |
| results of evaluation | varnish stability | OK | OK | OK | OK | OK | OK | OK | OK | OK | OK |
|  | flame retardancy | very good | very good | very good | good | good | poor | good | poor | good | good |
|  | peel strength | 13 very good | 11 very good | 9 good | 14 very good | 12 very good | 15 very good | 7 good | 17 very good | 15 very good | 17 very good |
|  | Tg (° C.) | 280 | 270 | 290 | 260 | 290 | 115 | 80 | 130 | 130 | 130 |
|  | solder heat resistance | good | good | good | good | good | poor | good | poor | poor | poor |
|  | circuit embeddability | good | good | good | good | good | good | good | good | good | good |
|  | bendability | OK | OK | OK | OK | OK | OK | OK | OK | OK | OK |
|  | migration | very good | very good | very good | very good | very good | very good | poor | very good | very good | very good |

Details for the individual components in Tables 1 and 2 are provided below.
TMA: trimellitic anhydride (Mitsubishi Gas Chemical Co., Ltd.)
PMDA: pyromellitic anhydride (Daicel Chemical)
TPA: terephthalic acid (Mitsubishi Gas Chemical Co., Ltd.)
ADA: adipic acid (Asahi Kasei Corporation)
MDI: Cosmonet M-100 (Mitsui Takeda Fluorochemical) (4,4'-diphenylmethanediisocyanate)
NDI: Cosmonet NDI (Mitsui Takeda Fluorochemical) (naphthalenediisocyanate)

Each of the resulting polyamideimide resin-precursor compositions was polymerized (prepolymerization) while stirring under curing conditions of (1) 2 hours at 80° C., (2) 5 hours at 120° C., and (3) 1 hour at 150 20 C. This was followed by cooling and dilution by the addition of dimethylformamide so as to give a solids concentration of 25 weight %.

Coating on a release film was then carried out so as to give a 25-μm thickness of the aforementioned dilution and a semicured (B-stage) polyamideimide resin layer was obtained under prescribed curing and drying conditions (temperature=80 to 160° C., time=1 to 30 minutes). In addition, in order to obtain the completely cured (C-stage) polyamideimide resin layer, the B-stage polyamideimide resin layer was subjected to an additional polymerization reaction under prescribed curing conditions (temperature=140 to 200° C., pressure=30 to 60 MPa, time=20 to 120 minutes); cooling then gave the C-stage polyamideimide resin layer.

The following evaluation testing was carried out on each of the obtained polyamideimide resin layers.

(Flame Retardancy)

Samples were fabricated (B-stage sample and a sample heated for 168 hours at 70° C.) and the flame retardancy was evaluated in accordance with the UL94 standard in terms of whether a V-0 grade could be met.
    very good: the V-0 grade of the UL94 standard was completely met
    good: the V-0 grade of the UL94 standard was almost met, no practical problems
    poor: impractical, the V-0 grade of the UL94 standard could not be met (Peel Strength)

In accordance with JPCA BM-02, a sample was prepared and the peel strength (adhesive strength) was evaluated by a 180° film (C-stage resin layer) peel.

very good: peel strength at least 10 N/cm, the adhesive strength was entirely unproblematic from a practical standpoint good: peel strength at least 7 N/cm, but less than 10 N/cm, a practical adhesive strength was obtained poor: peel strength less than 7 N/cm, the adhesive strength was inadequate (The Glass-transition Temperature: Tg)

Individual semi-cured (B-stage) resin plates were prepared in a thickness that would enable measurement by dynamic mechanical analysis (DMA) and the Tg (° C.) was measured.

(Bendability)

A measurement sample was fabricated and the bendability was measured in accordance with JIS C-5016. With regard to the bending angle, a radius R of 0.38 m was used, and a score of OK was assigned when 1000 times was exceeded.

(Migration)

Figure 3:
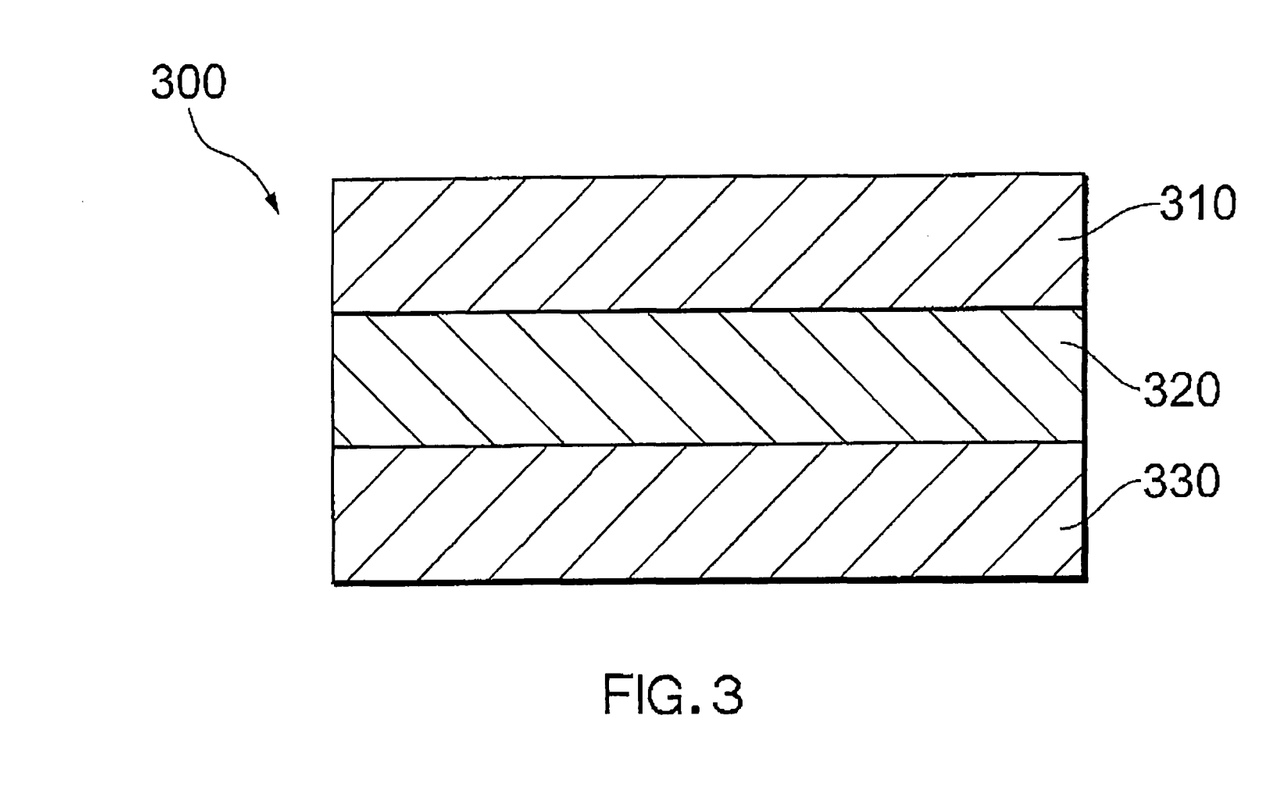
FIG. 3 is a schematic cross section that shows an embodiment of a single-sided copper-clad laminate according to the present invention.
Figure 4:
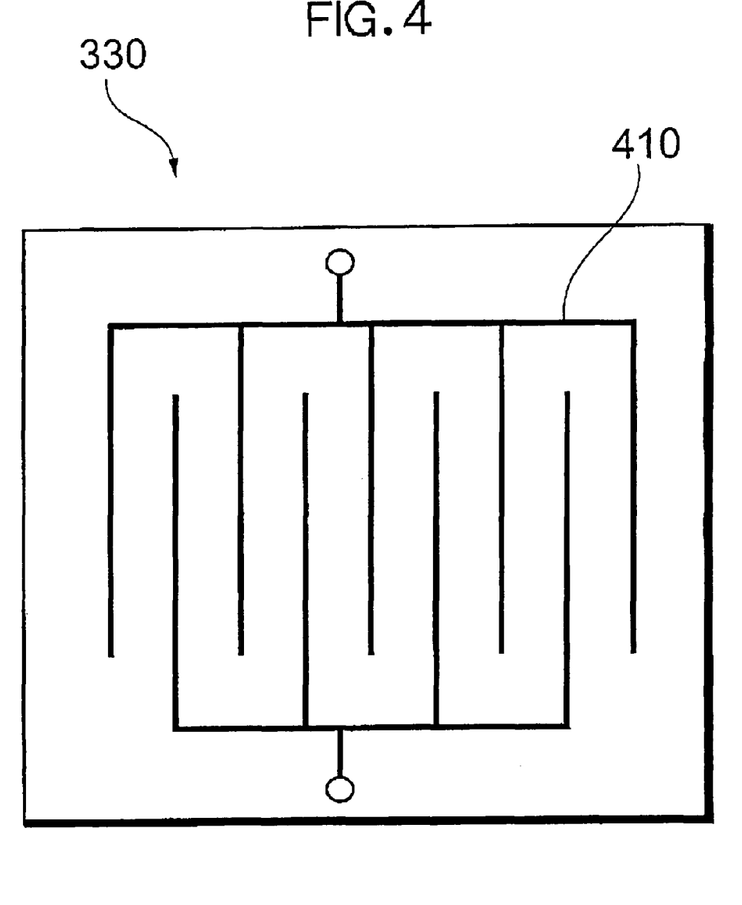
FIG. 4 is a plan view that shows the circuit pattern formed in the metal foil plane of a single-sided copper-clad laminate used in property evaluation testing.

FIG. 3 shows the structure of the single-sided copper-clad laminate used in the migration test. FIG. 4 shows the design of the circuit pattern for carrying out the migration test.

As shown in FIG. 3, the single-sided copper-clad laminate 300 was constructed from a polyimide film layer 310 with a thickness of 25 μm (1 mil), a layer 320 of adhesive comprising a known adhesive for FPC applications, and a copper foil layer 330 comprising 35-μm (1 ounce) cold-rolled copper foil.

A prescribed treatment was first executed on the copper foil layer 330 of the single-sided copper-clad laminate 300 to form the circuit pattern 410 shown in FIG. 4. This circuit pattern 410 was elaborated as a comb-shaped pattern with line/space=50 μm/50 μm.

Using the resin-precursor composition prepared for each blend, a coverlay was fabricated in such a manner that the semi-cured (B-stage) resin layer had a thickness of 25 μm. This coverlay was layered on the circuit pattern 410 on the single-sided copper-clad laminate 300 and a flexible printed circuit board was fabricated by hot-press bonding at 180° C. and 40 MPa for 1 hour.

Testing was carried out on the resulting flexible printed circuit board under prescribed conditions (voltage: DC100V, temperature: 85° C., humidity: 85% RH), and the change in voltage was measured at a specified time (1000 hr). The migration was evaluated based on the following scale.

very good: the resistance value over the prescribed time period is at least $1.0 \times 10^9 \Omega$, the migration behavior is excellent good: the resistance value over the prescribed time period is at least $1.0 \times 10^7 \Omega$ but less than $1.0 \times 10^9 \Omega$, this is a level unproblematic from a practical standpoint poor: the resistance value over the prescribed time period is less than $1.0 \times 10^7 \Omega$, impractical Migration (also called copper migration) is a phenomenon in which, when voltage is applied between copper foil conductors, the copper ion elutes from the anode with ionic impurities in the adhesive acting as a medium and copper eventually precipitates on the cathode side. As this precipitated copper accumulates, the precipitated copper undergoes dendritic growth between the conductors. This is called a "tree", and when treeing is produced the resistance between conductors is reduced and the insulating properties can no longer be maintained.

(Circuit Embeddability)

Figure 5:
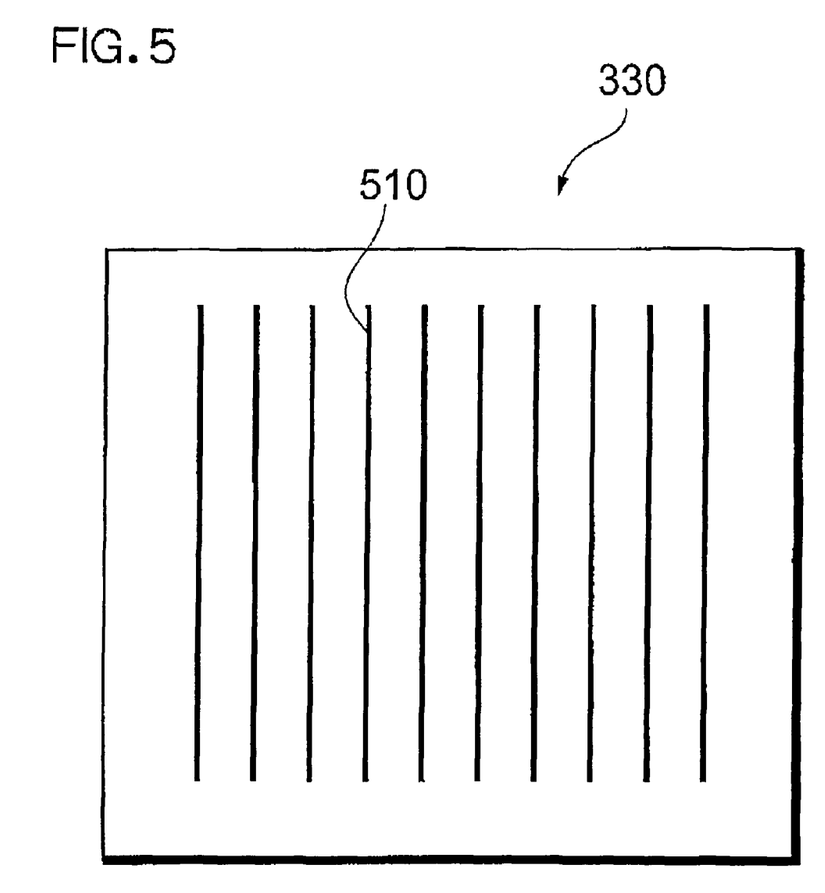
FIG. 5 is a plan view that shows the circuit pattern formed in the metal foil plane of a single-sided copper-clad laminate used in property evaluation testing.

The sample used in circuit embeddability testing was prepared by executing a prescribed treatment on the copper foil layer 330 of the single-sided copper-clad laminate 300 shown in FIG. 3 to form the circuit pattern 510 shown in FIG. 5. This circuit pattern was a straight line pattern with line/space=100 μm/100 μm.

Then, using the resin-precursor composition prepared for each blend, a coverlay was fabricated in such a manner that the semi-cured (B-stage) resin layer had a thickness of 25 μm. This coverlay was layered on the circuit pattern 510 on the single-sided copper-clad laminate 300 and a flexible printed circuit board was fabricated by hot-press bonding at 180° C. and 40 MPa for 1 hour.

The presence/absence of voids between the lines and spaces was investigated microscopically on the resulting flexible printed circuit board.

good: no voids poor: voids are present (Solder Heat Resistance)

The resin layer side of the single-sided copper-clad laminate 300 shown in FIG. 3 was dipped and held in a 260° C. solder bath for 30 seconds. This was followed by an evaluation in which the presence/absence of peeling and blistering was determined by visual inspection.

good peeling and blistering are absent poor: peeling and blistering occur in some areas (Varnish Stability)

Prior to heating and curing, each polyamideimide resin-precursor composition was visually inspected for the presence of phase separation; the absence of phase separation was scored as OK.

As shown by the evaluation results in Tables 1 and 2, the polyamideimide resins obtained by polymerizing the component blends of Examples 1 to 10 gave an excellent post-cure flame retardancy, solder heat resistance, circuit embeddability, flexibility, adhesive strength, and migration behavior; a high Tg was also confirmed.

We claim:

1. A polyamideimide resin for flexible printed circuit boards, which is obtained by the polymerization reaction of an acid component comprising at least a dianhydride and an aromatic dicarboxylic acid with a diisocyanate compound or diamine compound in an approximately equimolar amount with respect to the total molar amount of the acid component, wherein the molar amount of the dianhydride is 0.2 to 0.4 taking the total molar amount of the acid component as 1, and
    wherein the dianhydride is at least one dianhydride selected from the group consisting of the anhydride of diphenylsulfonetetracarboxylic acid, benzophenonetetracarboxylic acid, pyromellitic acid, napthalenetetracarboxylic acid, diphenyltetracarboxylic acid, bis(dicarboxyphenyl)propane, bis(dicarboxyphenyl)sulfone and bis(dicarboxyphenyl)ether, and
    the acid component further contains an aliphatic dicarboxylic acid, and wherein the aliphatic dicarboxylic acid is at least one aliphatic dicarboxylic acid selected from the group consisting of adipic acid, sebacic acid, maleic acid, fumaric acid, decanedioic acid, dodecanedioic acid, and dimer acid.

2. A metal-clad laminate, in which the polyamideimide resin for flexible printed circuit boards according to claim 1 is formed as a layer on a metal foil.

3. A coverlay in which the polyamideimide resin for flexible printed circuit boards according to claim 1 is formed as a film.

4. A flexible printed circuit board comprising the coverlay according to claim 3 disposed on a metal foil that has been formed into a circuit.

5. A resin composition comprising the polyamideimide resin for flexible printed circuit boards according to claim 1.

* * * * *